United States Patent [19]

Avery et al.

[11] Patent Number: 4,465,976
[45] Date of Patent: Aug. 14, 1984

[54] HALL ELEMENT WITH BUCKING CURRENT AND MAGNET BIASES

[75] Inventors: Grant D. Avery, Loudon; Jacob K. Higgs, Concord, both of N.H.

[73] Assignee: Sprague Electric Company, North Adams, Mass.

[21] Appl. No.: 342,687

[22] Filed: Jan. 26, 1982

[51] Int. Cl.³ .................. G01R 33/06; H01L 43/06
[52] U.S. Cl. ............................. 324/251; 338/32 H
[58] Field of Search ............ 324/207, 208, 251, 252; 338/32 H, 32 R

[56] References Cited

U.S. PATENT DOCUMENTS

| 3,195,043 | 7/1965 | Burig et al. | 338/32 H |
| 3,416,010 | 12/1968 | Kuhnlein et al. | 324/251 |
| 3,613,021 | 10/1971 | Scheidt | 330/6 |

OTHER PUBLICATIONS

Gersbach, J. E., "Hall Cell Bias and Offset Circuit", IBM Technical Disclosure Bulletin, vol. 6, No. 20, Nov. 1977, pp. 2149–2150.

Sprague Engineering Bulletin, 27701, "Hall Effect IC Application Guide", Mar., 1980, p. 17.

Primary Examiner—Gerard R. Strecker
Assistant Examiner—Walter E. Snow

[57] ABSTRACT

A strong magnet is bonded to a conventional Hall element package. A bias current is introduced at one of the output terminals of the Hall element in the direction to cause a reduction in the magnet-bias-induced output voltage. This output voltage is easily reduced by this means to zero. The resulting Hall-element detector is shrouded by a large magnetic biasing field while presenting a low or zero DC output component upon which the signal voltage will be superimposed.

4 Claims, 12 Drawing Figures

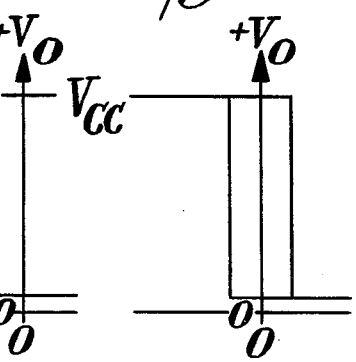
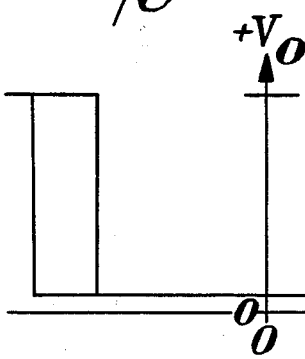
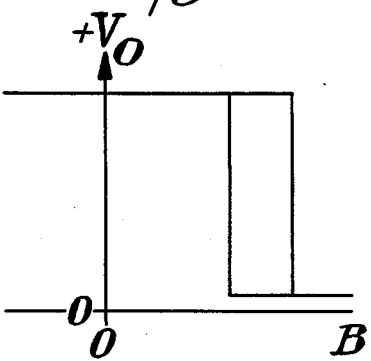
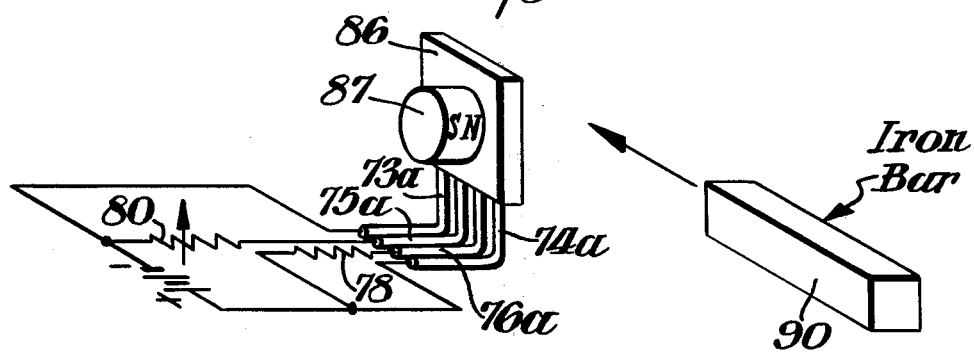
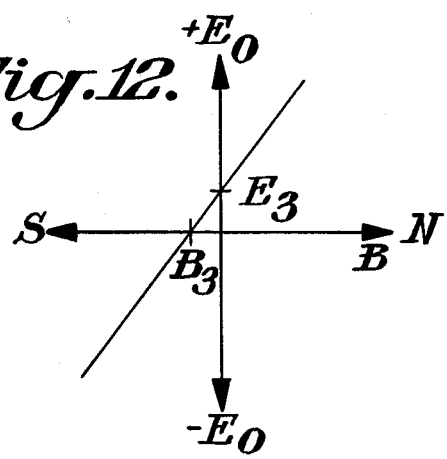

HALL ELEMENT WITH BUCKING CURRENT AND MAGNET BIASES

BACKGROUND OF THE INVENTION

This invention relates to a ferromagnetic-material detector and more particularly to such a detector including a Hall-element and a bias magnet.

When a ferromagnetic article passes by such a detector, the output voltage changes due to the distortion of the magnet bias field. However, with no ferromagnetic article nearby, the Hall element output voltage is a large steady value. Output signal voltages are always superimposed on this large DC voltage. It is therefore customary to capacitor couple or otherwise AC couple the output of such detectors to an amplifier and/or another signal responsive device.

Besides the extra expense of providing such an AC coupling, the system can only respond to moving ferromagnetic articles that must travel at least fast enough that the AC coupling means can follow it without substantial attenuation.

It is therefore an object of the present invention to provide a ferromagnetic-material detector that is capable of using a large magnetic bias field and has no substantial DC output component.

It is also an object of this invention to provide a ferromagnetic-material detector having a magnet bias and a bucking current bias to provide lower values of DC output voltage upon which the signal voltage will be superimposed.

SUMMARY OF THE INVENTION

A ferromagnetic-material detector includes a Hall element mounted with a magnet. The Hall element is preferably a conventional semiconductor Hall element having two energizing terminals by which an energizing current may be introduced in one direction through the body of the Hall element and two output terminals across which the Hall voltage, in a direction substantially at right angles to the energizing-current direction, may be sensed. The magnet is fixedly mounted with respect to the Hall element in a position to establish biasing flux lines that are (or a component of which is) substantially orthogonal to the energizing current and to the output-voltage sense directions. A bias current generator means is connected to one of the output terminals for introducing a bias current in the Hall element. This current will be of a polarity that will tend to cancel or buck out the Hall voltage generated across the output terminals due to the magnet-bias flux lines.

Thus, in this invention the biasing magnet deflects the Hall-energizing current toward one of the output terminals and a circuit-bias means draws it away from that terminal.

When the magnitudes of the bias current and the bias flux are such that the Hall element output voltages induced, respectively, by each are equal, then the output voltage of the energized Hall element is exactly the same (near zero) as it would be without either the bias current or the bias flux. Thus, in this situation the sensitivity of the Hall element to changes in ambient magnetic field remains unchanged including having the same small off-set voltage that may be characteristic of the particular Hall element used. Preferably this Hall element off-set voltage is also nullified by slight further adjustment of the bias current.

The bias magnet provides a reference source of magnet field that will be distorted at the Hall element upon introduction in that field of a magnetic article. Thus the stronger the field, the greater will be the change in flux at the Hall element output. A strong magnet bias causes a large initial output voltage of the Hall element. According to this invention, all or a portion of the magnet-effected voltage of the Hall element output is canceled or compensated by a bias current in at least one of these same output terminals, retaining the advantage of a large amplitude magnet-bias for detection of ferromagnetic materials with high sensitivity.

BRIEF DESCRIPTION OF THE DRAWINGS

FIG. 8 shows a hybrid picture combining a perspective view of a packaged Hall-element circuit of FIG. 7 with both current bias and magnet bias to provide a symmetrical hysteresis characteristic.

FIG. 9 shows a graph of the output voltage from the switching detector of FIGS. 7 and 8 with current and magnet biases as a function of the ambient magnetic field, illustrating the symmetrical hysteresis characteristic.

FIG. 10 shows a graph of the output voltage from the switching detector of FIG. 7 with the magnet but without the current bias.

FIG. 11 shows a graph of the output voltage from the switching detector of FIG. 7 without the current bias and without a magnet bias.

FIG. 12 shows a graph of the output voltage of the Hall element in FIG. 7 for the double-biased symmetrical-hysteresis detector corresponding to the graph of FIG. 9.

DESCRIPTION OF THE PREFERRED EMBODIMENTS

Figure 1:
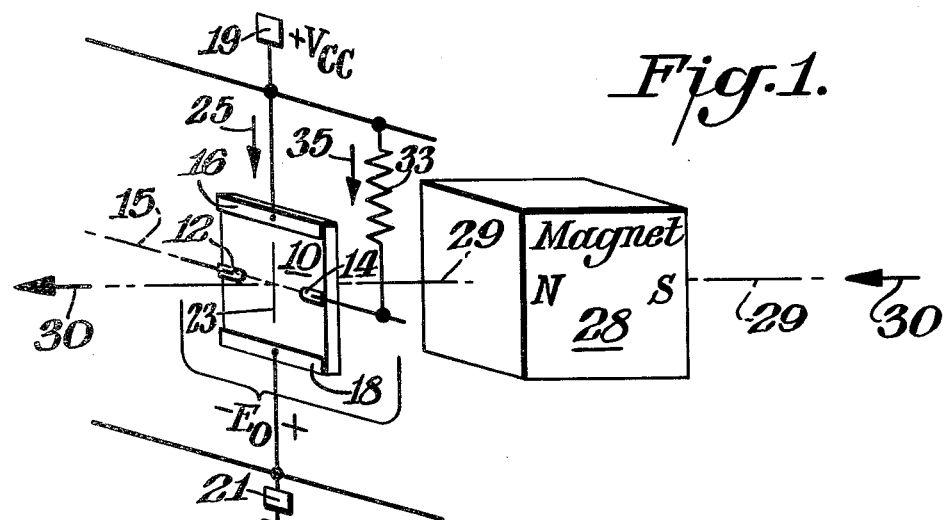
FIG. 1 shows a simplified schematic of a Hall element connected to an energizing circuit and an adjacent magnet in accordance with this invention.

A semiconducing Hall element 10, shown in FIG. 1, has two output terminals 12 and 14 lying in axis 15, and two energizing terminals 16 and 18. With no magnetic field and no current flowing through the output terminals 12 and 14, a voltage, $V_{cc}$, applied through terminal pad 19 to energizing terminal 16, relative to ground, pad 21 and terminal 18, will cause a sheet of current to flow vertically parallel to the other axis 23 defining the plane of the Hall element 10.

When the supply voltage $V_{cc}$ is positive at pad 19, a conventionally directed (downward as shown) current 25 flows through the Hall element 10 from pad 19 to pad 21. A magnet 28 is mounted adjacent the Hall element 10 as shown with the axis 29 of the magnet about centered in the Hall element 10 and othogonal to the plane of the Hall element 10 as is defined by axis 15 and 23. Magnetic flux generated by magnet 28 emanates from the north pole of magnet 28 in the direction of the arrows 30.

Figures 2, 3, 4:
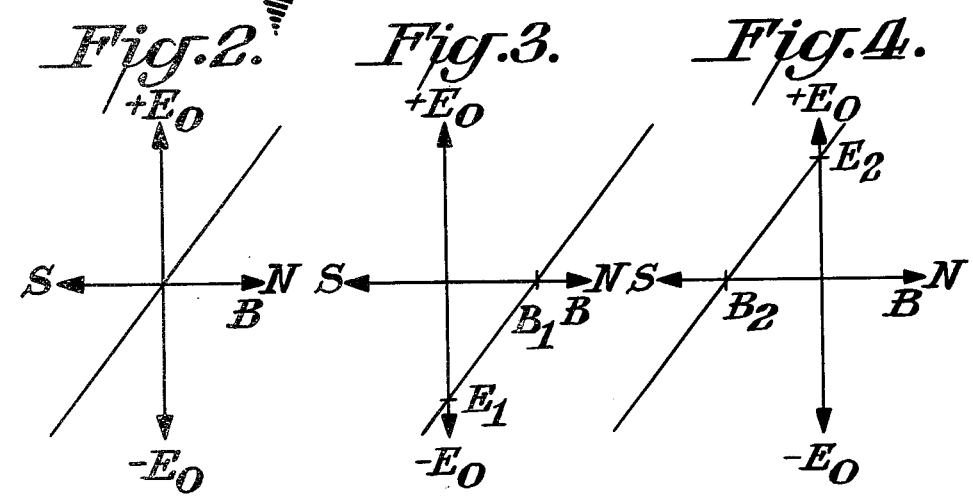
FIG. 2 shows a graph of the output voltage at the Hall element in FIG. 1 as a function of ambient magnetic field, without the current bias resistor and without the magnet, or with both the magnet and resistor.
FIG. 3 shows a graph of the output voltage at the Hall element in FIG. 1 as a function of ambient magnetic field, with the magnet and without the resistor.
FIG. 4 shows a graph of the output voltage at the Hall element in FIG. 1 as a function of ambient magnetic field, with the resistor but without the magnet.

Without the magnet, the output voltage $E_0$ across the output terminals 12 and 14 varies as a function of ambient magnetic flux (normal to the plane of the Hall element 10), as indicated in the graph of FIG. 2, assuming there is no "off-set" voltage, e.g. due to a slight assymetry in the positioning of the output terminals 12 and 14 contacting the body of the Hall element. With the magnet 28 mounted as shown in FIG. 1, the output voltage $E_0$ as a function of ambient magnetic field to the Hall element 10 (not generated by magnet 28) is changed to the characteristic shown in FIG. 3. When the ambient field is zero, the output voltage $E_0$ is a minus $E_1$. Or when the ambient magnetic field B is north field $B_1$, the output voltage $E_0$ is zero.

Now when once again removing the magnet 28 but this time connecting a resistor 33 in the circuit causing a current 35 to flow into output terminal 14, the Hall element output voltage $E_0$ characteristic as a function of ambient magnetic field is shifted leftward as shown in FIG. 4. A zero ambient field results in a positive output voltage $E_2$ and an ambient south field $B_2$ produces a zero output voltage. Now by restoring the magnet to its former position (as in FIG. 1), the combined effect on the output voltage of the magnet bias and the current bias is for one to at least partially nullify the other. In fact, it may for certain purposes be advantageous to adjust the value of resistor 33 (and thus the value of current 35) so that with no ambient magnetic field, the output voltage $E_0$ is just zero. The output voltage characteristic would again look like the graph of FIG. 2. Now however, unlike the situation mentioned above wherein both magnet 28 and resistor 33 were removed, a zero ambient field results in a zero output voltage while there exists near the Hall element a strong magnetic field generated by the magnet 28. Any ferromagnetic body (not shown) that approaches this exactly bucking double-biased Hall element 10 will cause the field to distort and usually intensify at the body of the Hall element 10. The output voltage will in that case increase in the positive direction. The stronger the magnet (28), the more sensitive the double biased Hall element becomes to movement of a nearby ferromagnetic body.

A ferromagnetic material detector as illustrated in FIG. 1 was built by bonding to a commercial packaged Hall element (10) type UGN 3604, (made by Sprague Electric Co., Concord, N.H.) a cylindrical samarium-cobalt magnet (28). The north pole of the magnet is adjacent the Hall element package. The magnet induced bias flux at the Hall element is 2.3 kilogauss. The magnet is 0.1 inch (2.54 mm) long and has a 0.25 inch diameter (6.4 mm).

An energizing current (25) was established in the Hall element (10) and a resistor (33) was connected to one output terminal to a positive voltage. The resistor was adjusted so as to reduce the Hall element output voltage to zero. This required introducing a bias current (35) of 22 microamperes.

A steel bar measuring $0.25 \times 0.25 \times 1$ inch $(6.4 \times 6.4 \times 25.4$ mm) was moved toward the energized and double-biased Hall element (10). When the bar was $\frac{1}{8}$ inch (3 mm) away from the Hall element, which was 1/16 inch (1.5 mm) away from the face of the package, the Hall element output voltage was 8 millivolts.

Figures 5, 6, 7:
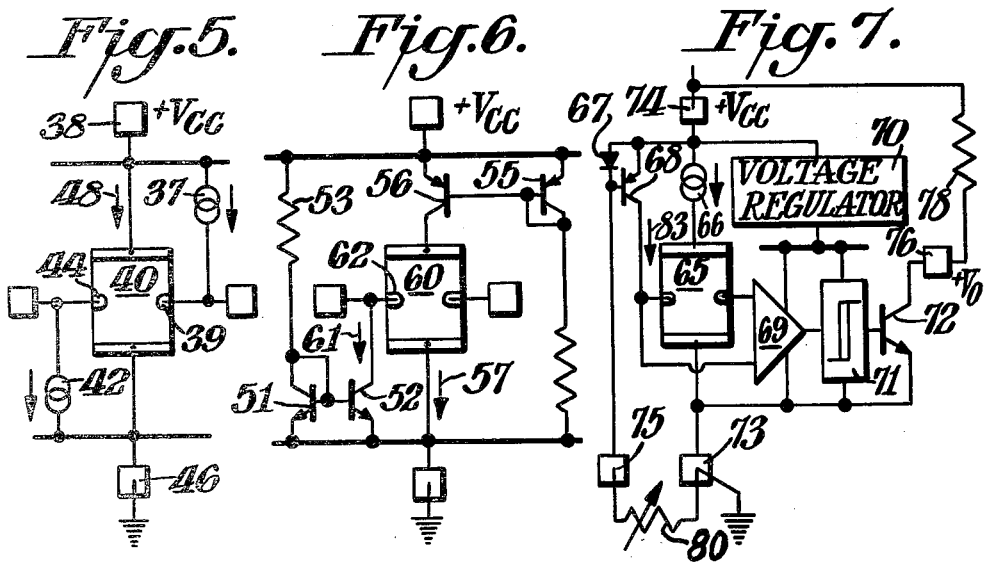
FIG. 5 is a schematic diagram of another current biased Hall element for use in a detector of this invention.
FIG. 6 is a schematic of yet another current biased Hall element for use in a detector of this invention.
FIG. 7 is a schematic of still another current biased Hall element for use in a switching detector of this invention.

Numerous other circuits may be used to provide the current bias. In FIG. 5, a high impedance current source 37 is connected from the positive power supply terminal 38 to the output terminal 39 of Hall element 40. A current source 42 is connected from the other output terminal 44 to the negative power supply terminal 46. When the current sources 37 and 42 produce equal magnitude currents, the biasing current is at right angles to the energizing current 48. Since the sensitivity of a Hall element, e.g. 10, is directly proportional to the vertical current components in the body. This biasing scheme tends to have no degrading effects on the sensitivity.

In this respect, and with reference to FIG. 6, the high impedance current source made up of transistors 51 and 52 and resistor 53 is generally superior to the resistor source of FIG. 1 because the resistor 33 tends to shunt part of the Hall element 10 in an asymmetrical manner. Also in FIG. 6, a current source made up of transistors 55 and 56 supplies a constant current 57 to the Hall element 60, reducing the effect of sensitivity of the unbalanced bias current 61 introduced at only one output terminal 62.

A switching ferromagnetic material detector may have the circuit shown in FIG. 7. It may be a silicon integrated circuit made up of Hall element 65, energizing current source 66, a biasing current source made of transistors 67 and 68, differential amplifier 69, voltage regulator 70, Schmitt threshold detector 71 exhibiting a hysteresis characteristic, output transistor 72 and having four terminal pads 73, 74, 75 and 76. A discrete load resistor 78 is connected between the output terminal pad 76 and the positive power supply terminal pad 74.

This circuit employs the double biased Hall element detector of this invention to new advantage. A discrete variable resistor 80 is connected to terminal pads 73 and 75 to provide a means for varying the bais current 83.

Referring to FIG. 8, integrated circuit package 86, including circuit portions 65, 66, 67, 68, 69, 70, 71 and 72 of FIG. 7, has a magnet 87 attached in a position to shift the hysteresis of the output voltage to and beyond the zero ambient field axis. The discrete resistor 80 is adjusted to move the hysteresis loop back to a symmetrical position about the zero field axis as is illustrated in FIG. 9. Removal of the resistor 80 would lead to the characteristic shown in FIG. 10 and subsequent removal of magnet 87 would result in the characteristic of FIG. 11.

The symmetrical hysteresis characteristic that may be imparted to this switching detector circuit (of FIG. 7), is illustrated in FIG. 9. It is particularly useful as an unusually sensitive ferromagnetic material sensor. For example, an unmagnetized iron bar 90 is shown approaching and about to pass by the detector package 86 in FIG. 8. It is also useful as an unusually sensitive detector for passing magnets such as the rotating multiple-pole ring magnet used in certain speedometers, flow meters, etc. Similar performance is obtained from a combination of only a Hall switch and a magnet assembly that is described by the present inventors in a patent application filed simultaneously herewith. The Hall-output voltage, induced by the magnet, in that case is set equal to the average switch "operate-release" flux levels, by adjusting the strength of the magnet.

It should be noted that in the double-biased symmetrical-hysteresis detector of this invention, having an output characteristic as shown in FIG. 9, double-biased Hall element 65 (FIG. 7) has an output voltage versus ambient field characteristic as is illustrated in FIG. 12, which is not symmetrical about the origin as is the characteristic of FIG. 2. These two particular conditions wherein the magnet bias is exactly compensated by a bucking current bias and wherein the current bias only partially compensates (with referal to the Hall element output voltage) the magnet bias, respectively, are indicative of the many useful ratios of relative strengths of a magnet and a bucking bias current in ferromagnetic material sensors of this invention.

What is claimed is:

1. A ferromagnetic-material detector comprising a Hall element and a magnet being fixedly mounted therewith to produce a magnet-bias flux through said Hall element for producing a magnet-bias-induced Hall voltage across the output terminals of said Hall element, and a bias current generator means being connected to at least one of said Hall element output terminals to cancel at least a portion of said magnetic-bias-induced voltage, said detector further comprising two energizing terminals through which an energizing current maybe introduced into the body of said Hall element from a DC power supply, said bias current generator being comprised of a current-mirror circuit that is connected between said at least one Hall element output terminal and one of said DC energizing terminals.

2. The detector of claim 1 wherein said bias current is of a magnitude for said current-induced opposite-polarity voltage to equal said magnet-bias-induced Hall voltage and produce a near zero net voltage across said output terminals.

3. The detector of claim 1 wherein said bias current generator means is additionally comprised of another current-mirror circuit connected between the other side of said DC power supply and the other of said output terminals.

4. The detector of claim 3 wherein the amplitude of the bias currents established by each of said two current mirror circuits are substantially equal.

* * * * *

UNITED STATES PATENT AND TRADEMARK OFFICE
CERTIFICATE OF CORRECTION

PATENT NO. : 4,465,976
DATED : August 14, 1984
INVENTOR(S) : Grant D. Avery et al It is certified that error appears in the above—identified patent and that said Letters Patent is hereby corrected as shown below:

Column 2, line 11, after "magnet-bias" insert -- field --

Signed and Sealed this

First Day of January 1985

[SEAL]

Attest:

GERALD J. MOSSINGHOFF

*Attesting Officer*          *Commissioner of Patents and Trademarks*